(12) United States Patent
Otremba et al.

(10) Patent No.: US 8,084,816 B2
(45) Date of Patent: Dec. 27, 2011

(54) SEMICONDUCTOR MODULE

(75) Inventors: Ralf Otremba, Kaufbeuren (DE); Josef Hoeglauer, Munich (DE); Klaus Schiess, Allensbach (DE)

(73) Assignee: Infineon Technologies AG, Neubiberg (DE)

(*) Notice: Subject to any disclaimer, the term of this patent is extended or adjusted under 35 U.S.C. 154(b) by 132 days.

(21) Appl. No.: 12/403,000

(22) Filed: Mar. 12, 2009

(65) Prior Publication Data
US 2009/0174056 A1 Jul. 9, 2009

Related U.S. Application Data

(62) Division of application No. 11/828,858, filed on Jul. 26, 2007, now Pat. No. 7,879,652.

(51) Int. Cl.
*H01L 23/48* (2006.01)
*H01L 29/78* (2006.01)

(52) U.S. Cl. ........ 257/341; 257/401; 257/724; 257/778; 257/787; 257/E29.257

(58) Field of Classification Search ............... 257/341, 257/401, 678, 723, 724, 778, 787, E21.418, 257/E29.257
See application file for complete search history.

(56) References Cited

U.S. PATENT DOCUMENTS

| | | | |
|---|---|---|---|
| 5,381,105 A | 1/1995 | Phipps | |
| 5,472,914 A | 12/1995 | Martin et al. | |
| 5,637,922 A | 6/1997 | Fillion et al. | |
| 5,756,648 A * | 5/1998 | Lee | 528/353 |
| 6,133,634 A | 10/2000 | Joshi | |
| 6,245,596 B1 | 6/2001 | Kosaki et al. | |
| 6,396,127 B1 | 5/2002 | Munoz et al. | |
| 6,406,934 B1 | 6/2002 | Glenn et al. | |
| 6,420,211 B1 | 7/2002 | Brunet et al. | |
| 6,521,354 B1 * | 2/2003 | Shimizu et al. | 428/620 |
| 6,528,880 B1 | 3/2003 | Planey | |
| 6,582,990 B2 | 6/2003 | Standing | |
| 6,624,522 B2 | 9/2003 | Standing et al. | |
| 6,677,669 B2 | 1/2004 | Standing | |
| 6,680,241 B2 | 1/2004 | Okamoto et al. | |
| 6,767,820 B2 | 7/2004 | Standing et al. | |
| 6,774,499 B1 | 8/2004 | Yang | |
| 6,890,845 B2 | 5/2005 | Standing et al. | |
| 7,271,470 B1 | 9/2007 | Otremba | |
| 7,368,324 B2 | 5/2008 | Weidner et al. | |
| 2003/0052405 A1 | 3/2003 | Moriguchi | |
| 2004/0235210 A1 | 11/2004 | Tamura et al. | |
| 2005/0218498 A1 | 10/2005 | Hata et al. | |
| 2006/0145319 A1 | 7/2006 | Sun et al. | |

FOREIGN PATENT DOCUMENTS

EP  1187204 A2  3/2002

* cited by examiner

*Primary Examiner* — Marcos D. Pizarro
(74) *Attorney, Agent, or Firm* — Dicke, Billig & Czaja, PLLC

(57) ABSTRACT

A semiconductor module is disclosed. One embodiment provides a first semiconductor chip having a first contact pad on a first main surface and a second contact pad on a second main surface, a first electrically conductive layer applied to the first main surface, a second electrically conductive layer applied to the second main surface, and an electrically insulating material covering the first electrically conductive layer, wherein a surface of the second electrically conductive layer forms an external contact pad and the second electrically conductive layer has a thickness of less than 200 μm.

13 Claims, 12 Drawing Sheets

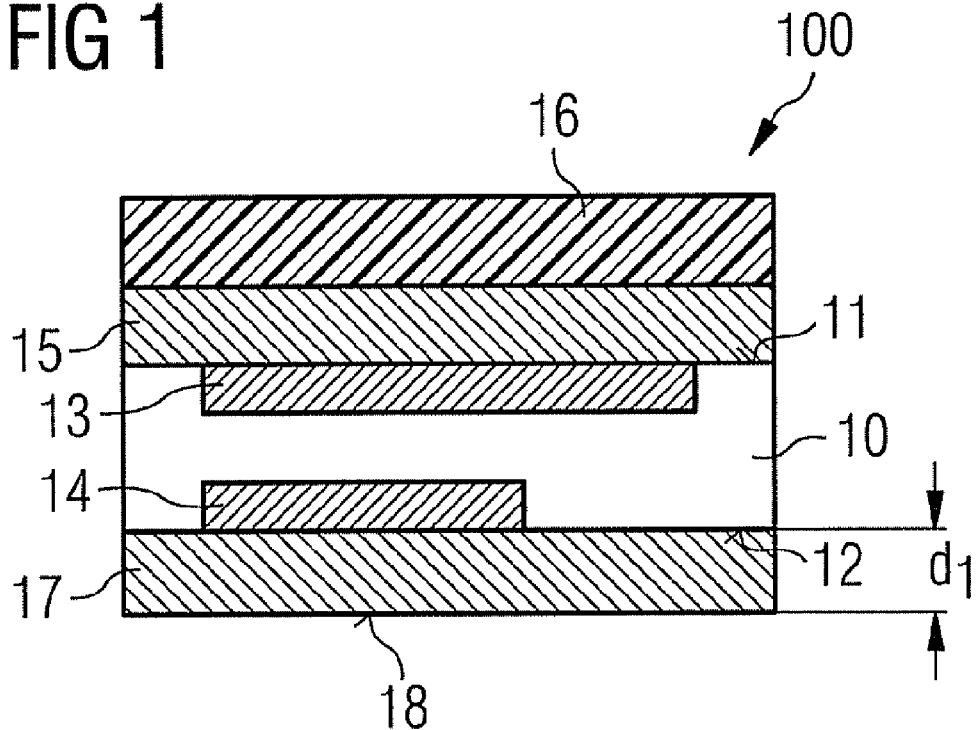
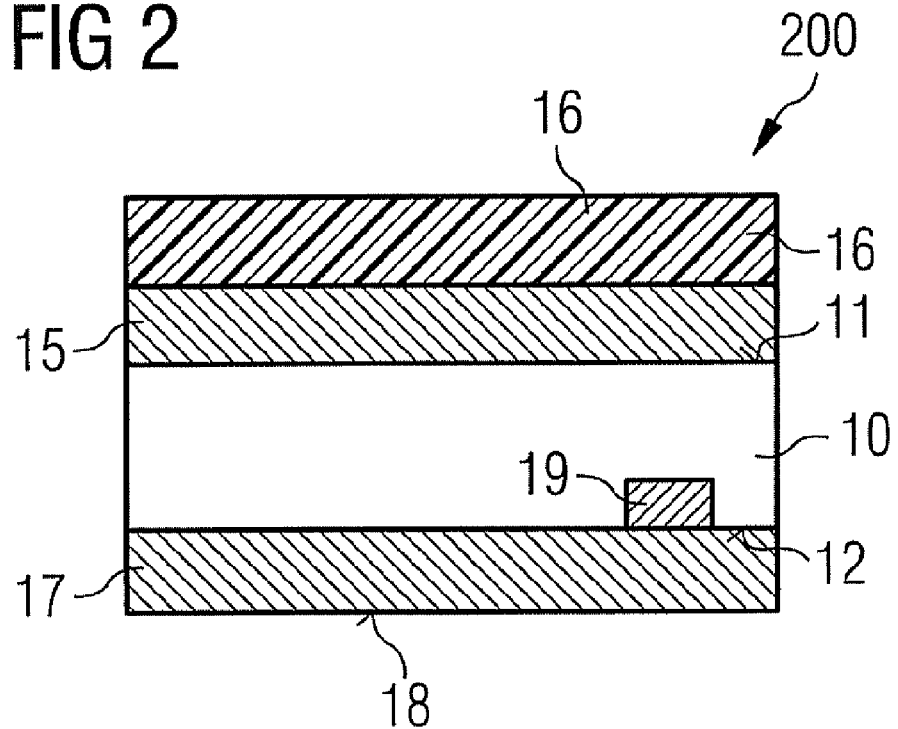

SEMICONDUCTOR MODULE

CROSS-REFERENCE TO RELATED APPLICATIONS

This Utility Patent Application is a divisional application of U.S. patent application Ser. No. 11/828,858, filed Jul. 26, 2007, which is herein incorporated in its entirety.

BACKGROUND

This invention relates to a semiconductor module and a method of assembling thereof.

Power semiconductor chips may, for example, be integrated into semiconductor modules. Power semiconductor chips are suitable, in particular, for the switching or control of currents and/or voltages.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a module 100 in a cross section according to an exemplary embodiment.

FIG. 2 schematically illustrates a module 200 in a cross section according to an exemplary embodiment.

DETAILED DESCRIPTION

Figure 3A:
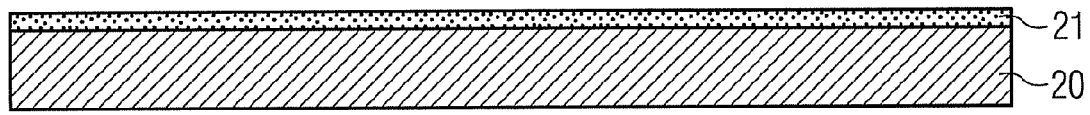
FIGS. 3A to 3J schematically illustrate an exemplary embodiment of a method to fabricate a module 300.
Figure 3B:
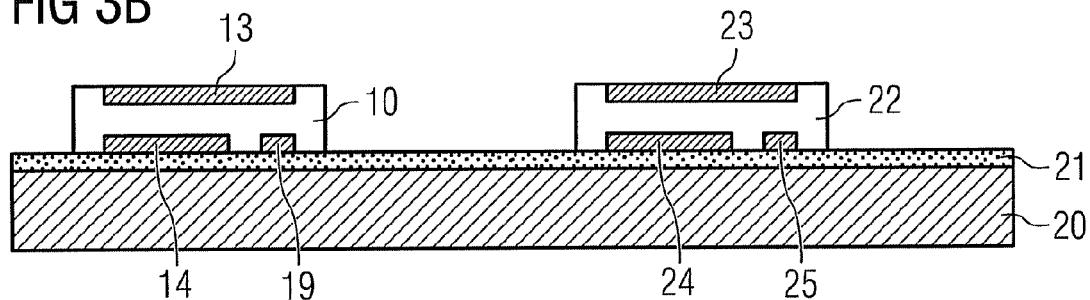
Figure 3C:
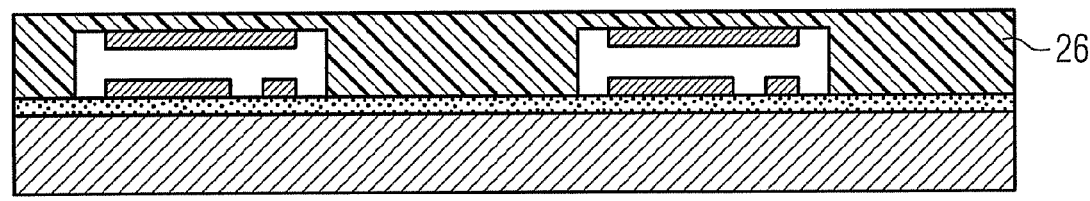

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following, embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more embodiments of the invention. It may be evident, however, to one skilled in the art that one or more the embodiments of the invention may be practiced with a lesser degree of these specific details. The following description is therefore not to be taken in a limiting sense, and the scope of the invention is defined by the appended claims.

Modules with semiconductor chips are described below. The semiconductor chips may be of extremely different types and may include for example, integrated electrical or electro-optical circuits. The semiconductor chips may, for example, be configured as power transistors, power diodes, IGBTs (Insulated Gate Bipolar Transistors), control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example, insulators, plastics or metals. Moreover, the semiconductor chips may be packaged or unpackaged.

The semiconductor chips have contact pads which allow electrical contact to be made with the semiconductor chips. The contact pads may be composed of any desired electrically conductive material, for example, of a metal, such as copper, aluminum or gold, a metal alloy or an electrically conductive organic material. The contact pads may be situated on the active surfaces of the semiconductor chips or on other surfaces of the semiconductor chips. In case of a power transistor, the contact pads include drain, source and gate terminals.

One or more electrically conductive layers may be applied to the semiconductor chips. The electrically conductive layers may be used to make electrical contact with the semiconductor chips from outside the modules and to make electrical connections among the semiconductor chips. The electrically conductive layers may be manufactured with any desired geometric shape and any desired material composition. The electrically conductive layers may, for example, be composed of linear conductor tracks, but may also be in the form of a layer covering an area. Any desired electrically conductive materials, such as metals, for example, aluminum, gold or copper, metal alloys or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers.

The modules described below include external contact pads. The external contact pads may be accessible from outside the module and may allow electrical contact to be made with the semiconductor chips from outside the module. Furthermore, the external contact pads may be thermally conductive and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material.

Surfaces of the modules, for example, surfaces of the external contact pads, may form an assembly plane. The assembly plane may serve to mount the module onto another component, such as a circuit board for example.

The modules may further include an electrically insulating material, for example, a mold material or an epoxy-based material. The electrically insulating material may cover any fraction of any number of surfaces of the components of the module. The term "electrically insulating" refers to the property of the electrically insulating material to be at most only marginally electrically conductive relatively to electrically conductive components of the module. In case the electrically insulating material being a mold material it may be any appropriate thermoplastic or thermosetting material. Various techniques may be employed to cover the components with the mold material, for example, compression molding or injection molding.

FIG. 1 schematically illustrates a module 100 in a cross section as an exemplary embodiment. The module 100 includes a first semiconductor chip 10 with a first main surface 11 and a second main surface 12. A first contact pad 13 is arranged on the first main surface 11, and a second contact pad 14 is arranged on the second main surface 12. The first semiconductor chip 10 may be a power semiconductor, for example, a power transistor or a power diode, or an IGBT. In case of a power transistor, the first and second contact pads 13 and 14 may be drain and source terminals, respectively.

The module 100 further includes a first electrically conductive layer 15 applied to the first main surface 11 of the first semiconductor chip 10 and an electrically insulating material 16 covering the first electrically conductive layer 15. A second electrically conductive layer 17 is applied to the second main surface 12 of the first semiconductor chip 10. A surface 18 of the second electrically conductive layer 17 forms an external contact pad. The exposed surfaces 18 of the second electrically conductive layer 18 may be used to electrically couple the module 100 to other components, for example, a circuit board. The second electrically conductive layer 17 has a thickness d, of less than 200 µm and, in particular less than 100 µm and in particular in the range between 50 and 100 µm.

FIG. 2 schematically illustrates a module 200 in a cross section as a further exemplary embodiment. The module 200 includes a first semiconductor chip 10 with a first main surface 11 and a second main surface 12, wherein a gate electrode 19 is arranged on the second main surface 12. A first electrically conductive layer 15 is applied to the first main surface 11 of the first semiconductor chip 10 and an electrically insulating material 16 covers the first electrically conductive layer 15. A second electrically conductive layer 17 is applied to the second main surface 12 of the first semiconductor chip 10. A surface 18 of the second electrically conductive layer 17 forms an external contact pad. The second electrically conductive layer 17 may have a thickness greater than 200 µm, but its thickness may also be smaller than 200 µm and in particular smaller than 100 µm. The first semiconductor chip 10 may, for example, be a power transistor or an IGBT.

Figure 3D:
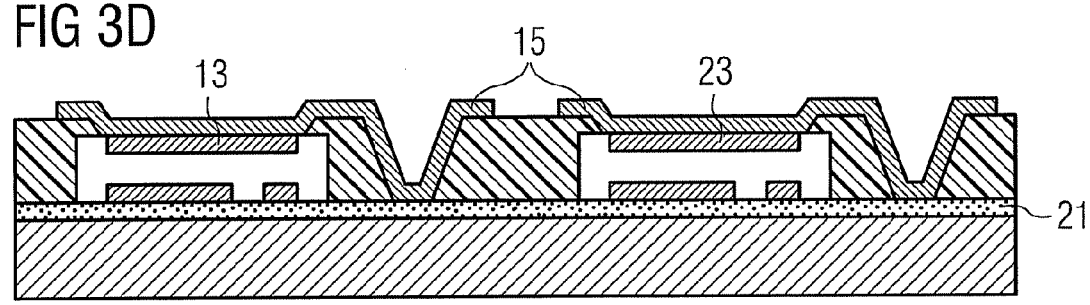
Figure 3E:
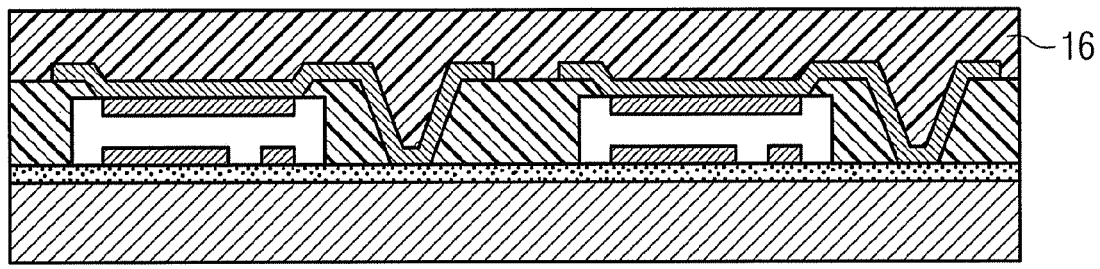
Figure 3F:
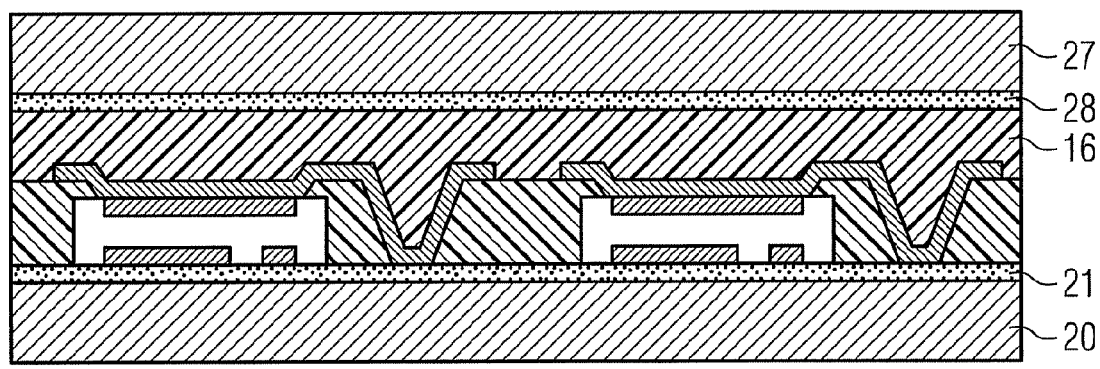
Figure 3G:
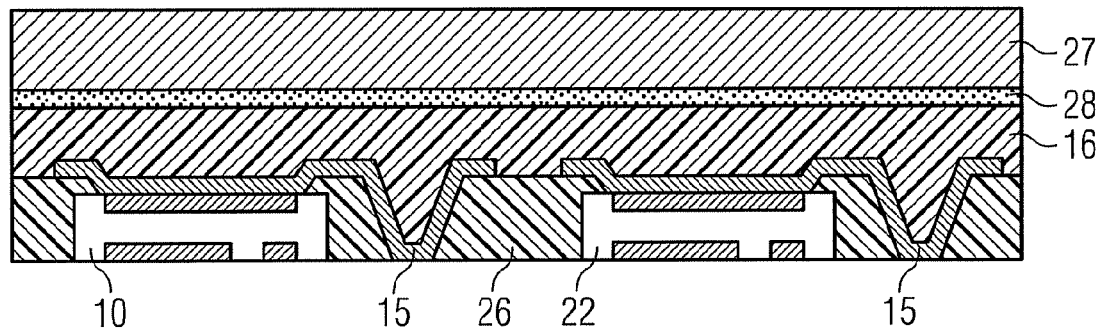
Figure 3H:
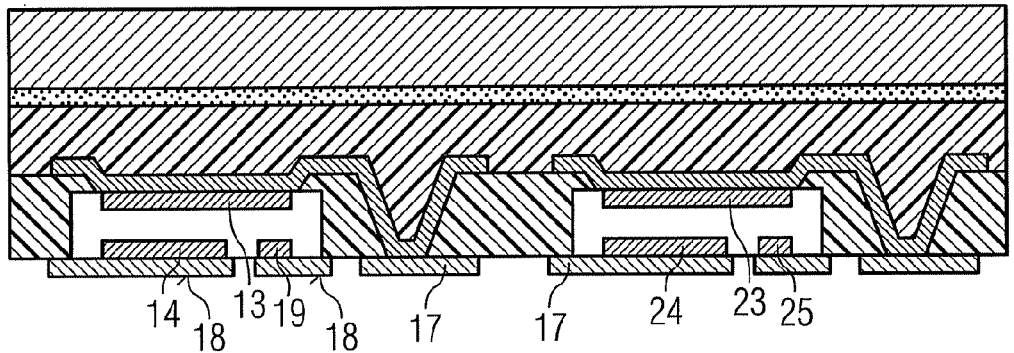
Figure 3I:
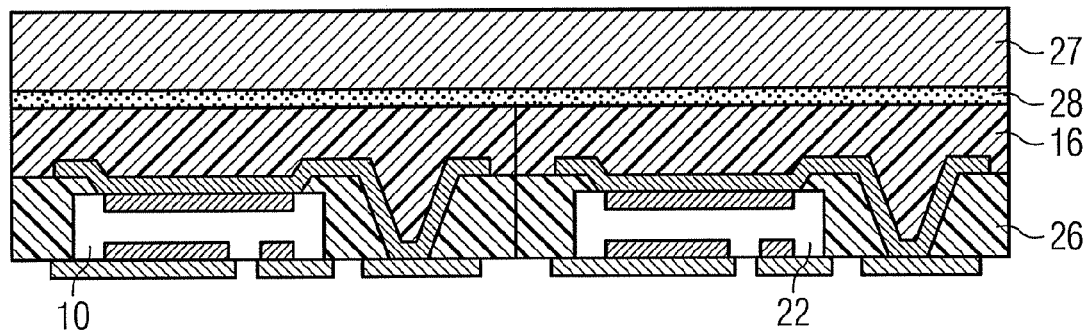
Figure 3J:
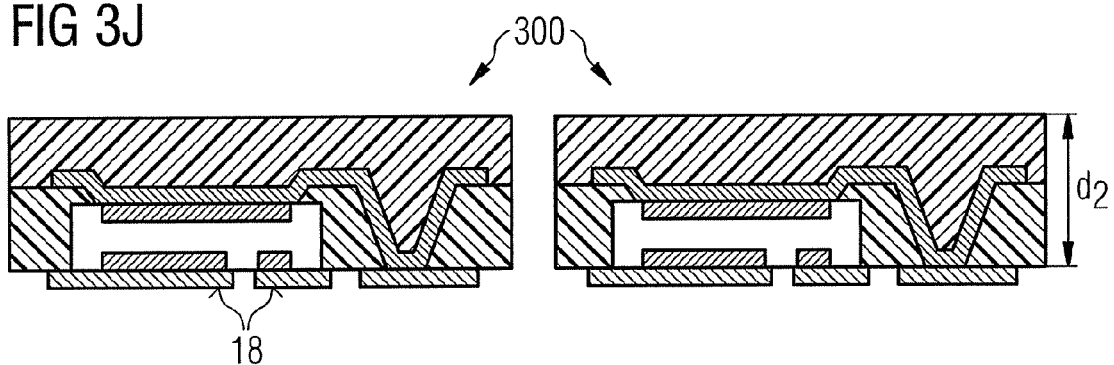

In FIGS. 3A to 3J different stages of the fabrication of a module 300, which is illustrated in FIG. 3J, are exemplarily illustrated. The module 300 is an implementation of the modules 100 and 200 illustrated in FIGS. 1 and 2. In order to manufacture the module 300, a first carrier 20 is provided (see FIG. 3A). The first carrier 20 may be rigid or may be flexible to a certain degree and may be fabricated from materials, such as metals, metal alloys or plastics. The first carrier 20 may be electrically conductive or insulating. An adhesive tape 21, for example, a double sided sticky tape, may be laminated on the first carrier 20. The first semiconductor chip 10 and a second semiconductor chip 22 are fixed on the first carrier 20 by using the adhesive tape 21 (see FIG. 3B). For attaching the semiconductor chips 10 and 22 to the first carrier 20, other kinds of attaching materials or methods may alternatively be used. It may also be provided that more than two semiconductor chips are attached to the first carrier 20.

The first semiconductor chip 10 has contact pads 13, 14 and 19. The second semiconductor chip 22 has contact pads 23, 24 and 25. If both semiconductor chips 10 and 22 are power transistors, the contact pads 13 and 23 may be drain terminals, the contact pads 14 and 24 may be source terminals and the contact pads 19 and 25 may be gate terminals. The semiconductor chips 10 and 22 may be mounted on the first carrier 20 with their source terminals 14 and 19 as well as their gate terminals 19 and 25 facing the first carrier 20.

An electrically insulating dielectric layer 26, for example, a photoresist layer or a silicon nitride layer, may be deposited on the first carrier 20 and the semiconductor chips 10 and 22. The dielectric layer 26 is deposited such that the semiconductor chips 10 and 22 are completely covered and the dielectric material 26 deposited on top of the semiconductor chips 10 and 22 has a certain thickness. For depositing the dielectric layer 26 spraying or spin coating or a squeegee technique or other appropriate methods may be used. The dielectric layer 26 is then structured, for example, by using photolithographic methods. The dielectric layer 26 is structured such that the drain terminals 13 and 23 are laid open and parts of the adhesive tape 21 are laid open as illustrated in FIG. 3D.

After the structuring of the dielectric layer 26 the first electrically conductive layer 15 is applied to the dielectric layer 26 and may be structured (see FIG. 3D). The first electrically conductive layer 15 may consist of a seed layer and a further layer which is galvanically deposited onto the seed layer. An electroless deposition method may be used to produce the seed layer. The seed layer may have a thickness of up to 1 µm and may, for example, be made of zinc. The electrical conductivity of the seed layer may be used to galvanically deposit an electrically conductive layer, for example, a copper layer, on the seed layer. The copper layer may have a thickness of up to 200 µm and may, in particular, be in the range between 50 µm and 100 µm. As an alternative to the electroless and galvanic deposition of the first electrically conductive layer 15, other deposition methods, such as physical vapor deposition, chemical vapor deposition, sputtering, spin-on processes, spray deposition or ink jet printing, may be employed.

The electrically insulating material 16 may be applied to the first electrically conductive layer 15 and to components of the module 300 which are not coated with the first electrically conductive layer 15. The electrically insulating material 16 is used to encapsulate the module 300 (see FIG. 3E). The electrically insulating material 16 may encapsulate any portion of the module 300 and may add stability to the module 300. The electrically insulating material 16 may be an epoxy or a mold material or another appropriate material. In case of a mold material, it may be composed of any appropriate thermoplastic or thermosetting material, in particular it may be composed of material commonly used in contemporary semiconductor packaging technology. Various techniques may be employed to cover the components of the module 300 with the mold material, for example, compression molding or injection molding.

After the electrically insulating material 16 is hardened, a second carrier 27 may be placed on the top of the electrically insulating material 16 (see FIG. 3F). The second carrier 27 may be similar to the first carrier 20 and may be manufactured from the same material. For attaching the second carrier 27 to the electrically insulating material 16 an adhesive tape 28, for example, a double sided sticky tape, may be laminated on the second carrier 27.

After the attachment of the second carrier 27 to the electrically insulating material 16, the semiconductor chips 10 and 22 are released from the first carrier 10, and the adhesive tape 21 is pealed from the semiconductor chips 10 and 22 as well as from the dielectric layer 26 (see FIG. 3G). The adhesive tape 21 may feature thermo-release properties, which allow the removal of the adhesive tape 21 during a heat treatment. The removal of the adhesive tape 21 from the semiconductor chips 10 and 22 is carried out at an appropriate temperature, which depends on the thermo-release properties of the adhesive tape 21 and is usually higher than 150° C., in particular approximately 200° C. Once the first carrier 20 is removed, the second carrier 27 is used to hold the module 300 while carrying out the following fabrication processes.

After the release of the first carrier 20 and the adhesive tape 21 the second main surfaces of the semiconductor chips 10 and 22, the bottom surface of the dielectric layer 26 as well as parts of the first electrically conductive layer 15 form a common plane. As illustrated in FIG. 3H the second electrically conductive layer 17 is applied to this common plane. Similar to the first electrically conductive layer 15, the second electrically conductive layer 17 may consist of a seed layer and a further layer which is galvanically deposited onto the seed layer. The seed layer may be an electrolessly deposited zinc layer and may have a thickness of up to 1 μm. The galvanically deposited layer may be a copper layer with a thickness of, for example, up to 200 μm and, in particular, in the range between 50 μm and 100 μm. Alternative methods to deposit the second electrically conductive layer 17 may be employed as discussed above in connection with the fabrication method of the first electrically conductive layer 15.

The second electrically conductive layer 17 may be structured such that areas are formed which are connected to the source terminals 14 and 24, the gate terminals 19 and 25 as well as the parts of the first electrically conductive layer 15, which are connected to the drain terminals 13 and 23 of the semiconductor chips 10 and 22. Thus, the separated sections of the second electrically conductive layer 17 form external contact elements, which enable to contact the drain, source and gate terminals of the semiconductor chips 10 and 22 from outside the module 300. The bottom surfaces of the separated sections of the second electrically conductive layer 17 are the external contact pads 18. Furthermore, the bottom surface of the second electrically conductive layer 17 forms an assembly plane which allows to mount the module 300 onto another component, such as a circuit board.

As illustrated in FIG. 3I, the two semiconductor chips 10 and 22 are separated from one another by separation of the dielectric layer 26 and the electrically insulating material 16, for example, by sawing. Before the two semiconductor chips 10 and 22 are released from the second carrier 27, they may be tested. The removal of the second carrier 27 and the adhesive tape 28 may be carried out in the same way as the removal of the first carrier 20 and the adhesive tape 21.

In FIG. 3J two modules 300 obtained from the fabrication process described above are illustrated. The modules 300 do not contain a carrier such as a leadframe. To the contrary, the electrically conductive layers 15 and 17 are plated on both main surfaces of the semiconductor chips 10 and 22. Furthermore, the first electrically conductive layer 15 may be connected to the second electrically conductive layer 17. This makes it possible to arrange all external contact pads 18 on the bottom surface of the module 300. Moreover, the surfaces of the external contact pads 18 connected to the drain and source terminals may be larger than the surfaces of the external contact pads 18 connected to the gate terminals. The enlarged surfaces for the drain and source terminals may be useful when high currents flow through the power transistors 10 and 22. The module 300 may have a thickness $d_2$ of less than 500 μm or 400 μm or 300 μm or less than 200 μm. The stability of the modules 300 may be provided by the electrically insulating material 16.

Figure 4A:
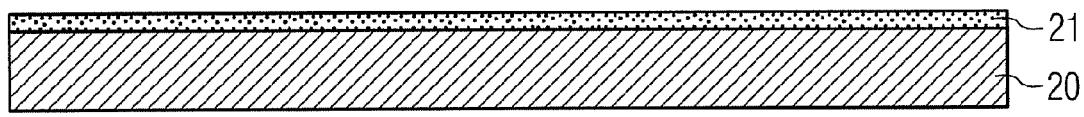
FIGS. 4A to 4J schematically illustrate an exemplary embodiment of a method to fabricate a module 400.
Figure 4B:
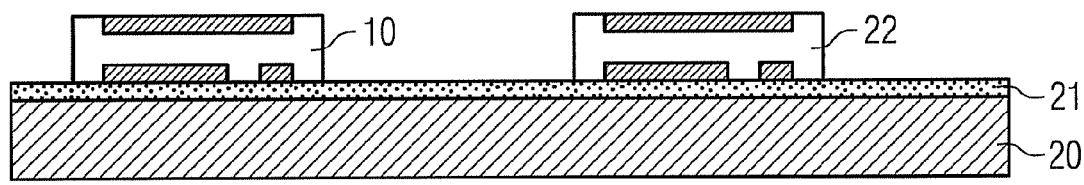
Figure 4C:
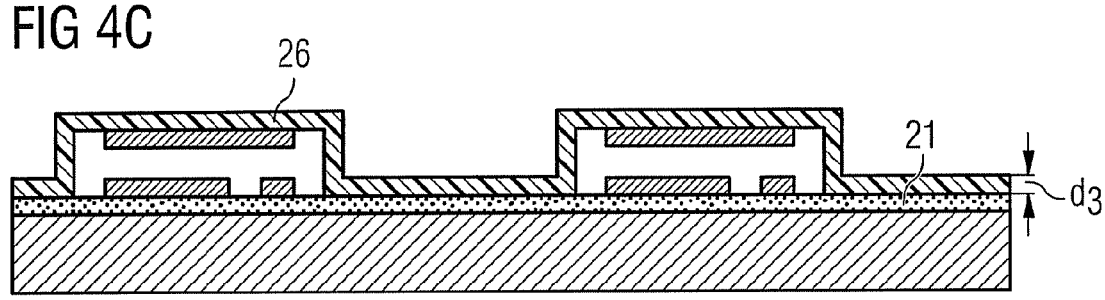
Figure 4D:
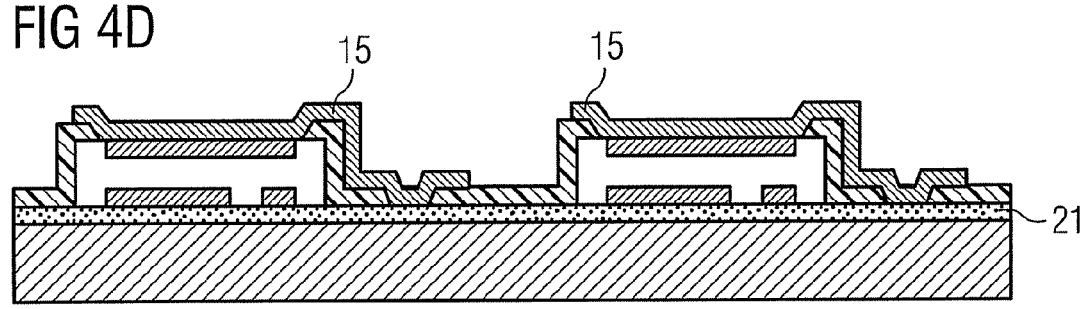
Figure 4E:
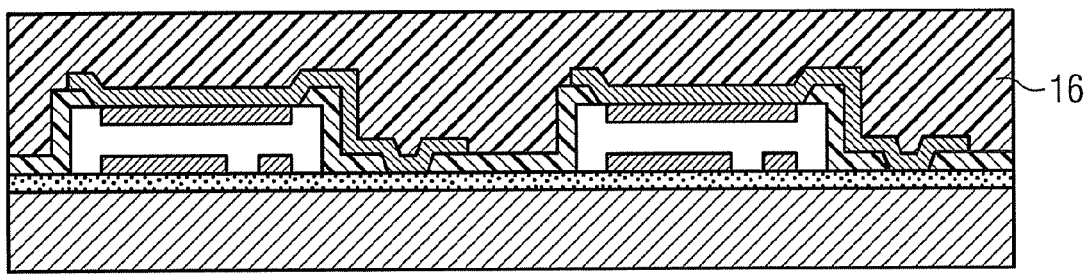
Figure 4F:
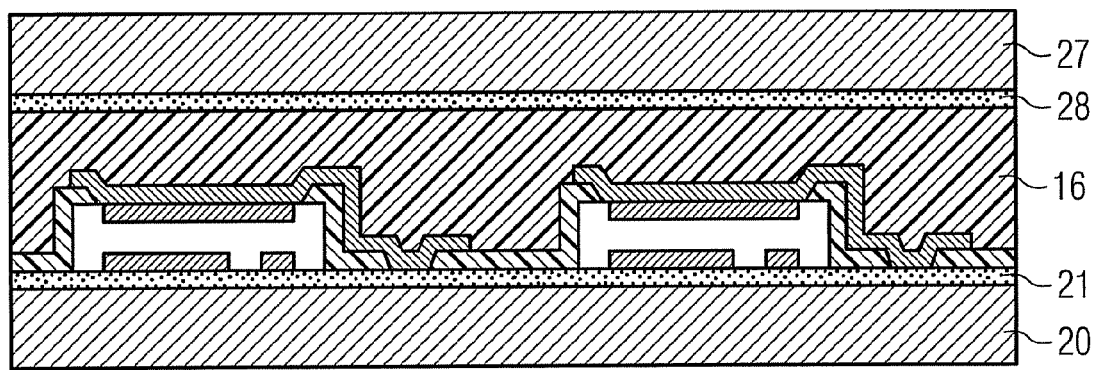
Figure 4G:
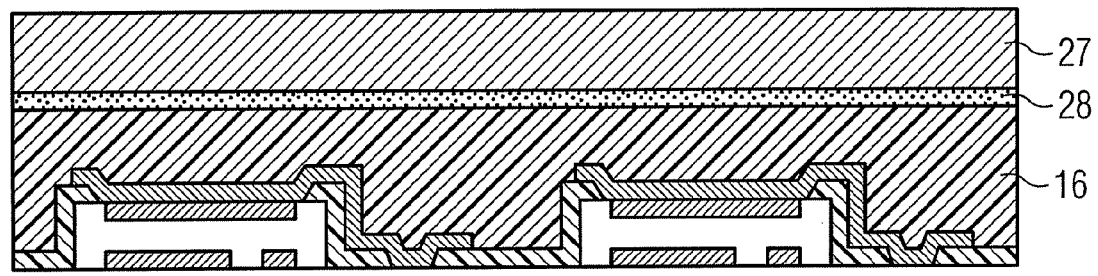
Figure 4H:
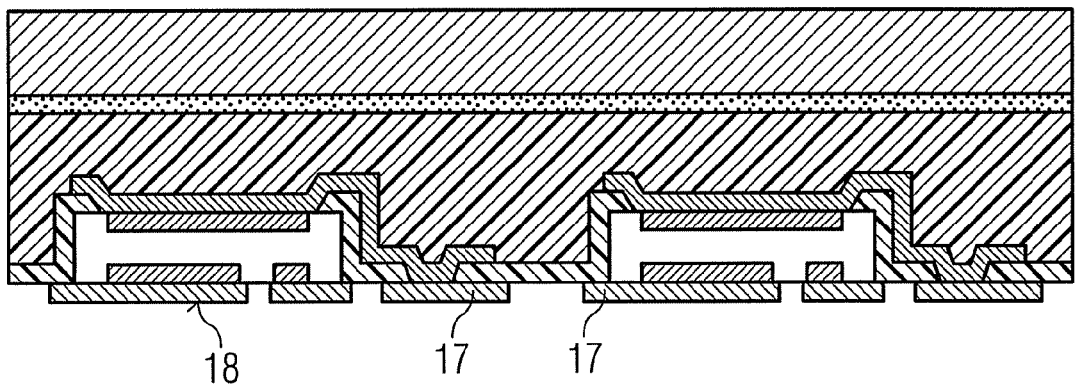
Figure 4I:
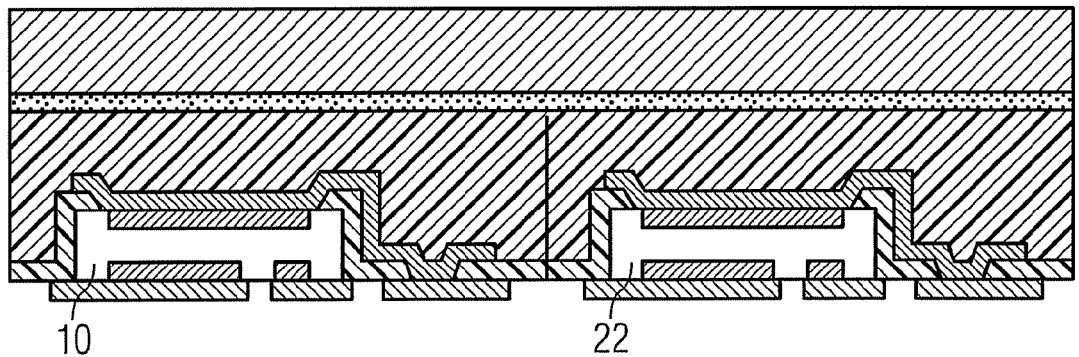
Figure 4J:
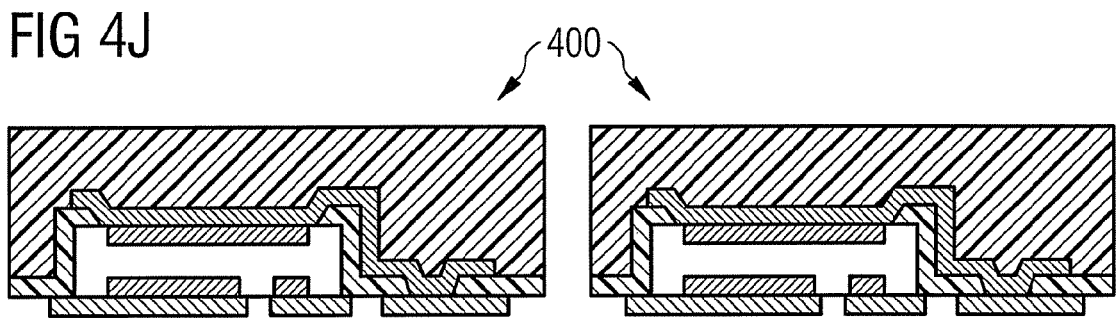

In FIGS. 4A to 4J different stages of the fabrication of a module 400, which is illustrated in FIG. 4J, are exemplarily illustrated. The fabrication method illustrated in FIGS. 4A to 4J is a variation of the fabrication method illustrated in FIGS. 3A to 3J. In contrast to the method of FIGS. 3A to 3J, in the present embodiment the dielectric layer 26 coating the top and side surfaces of the semiconductor chips 10 and 22 and the exposed portions of the top surface of the adhesive tape 21 has a uniform thickness $d_3$ (see FIG. 4C). The thickness $d_3$ is smaller than the height of the semiconductor chips 10 and 22 and, in particular, in the range between 5 and 50 μm. The dielectric layer 26 may, for example, be deposited by spraying. By using a dielectric layer 26 having a uniform thickness $d_3$, the openings through the dielectric layer 26, which are used to make electrical connections between the first electrically conductive layer 15 and the underlying structures, have all the same height (see FIG. 4D). The fabrication processes of the module 400 illustrated in FIGS. 4E to 4J may be similar or identical to the fabrication processes illustrated in FIGS. 3E to 3J.

Figure 5A:
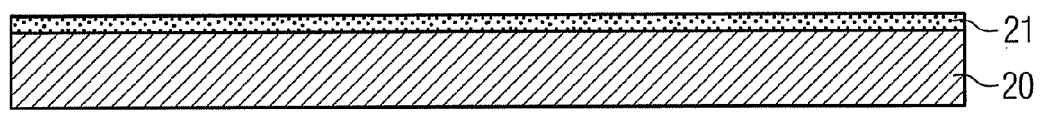
FIGS. 5A to 5J schematically illustrate an exemplary embodiment of a method to fabricate a module 500.
Figure 5B:
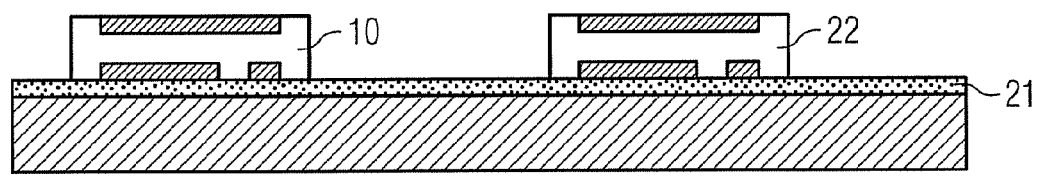
Figure 5C:
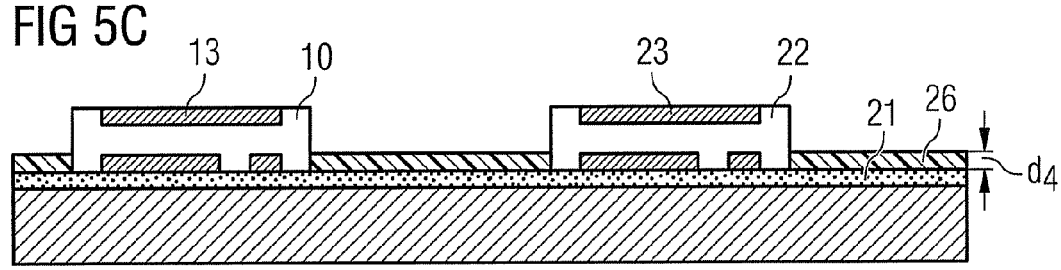
Figure 5D:
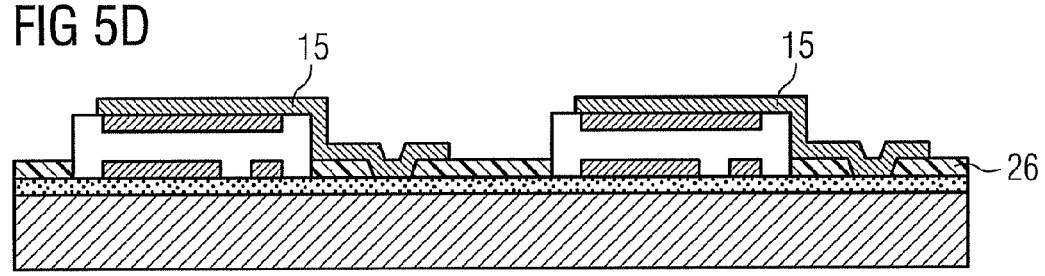
Figure 5E:
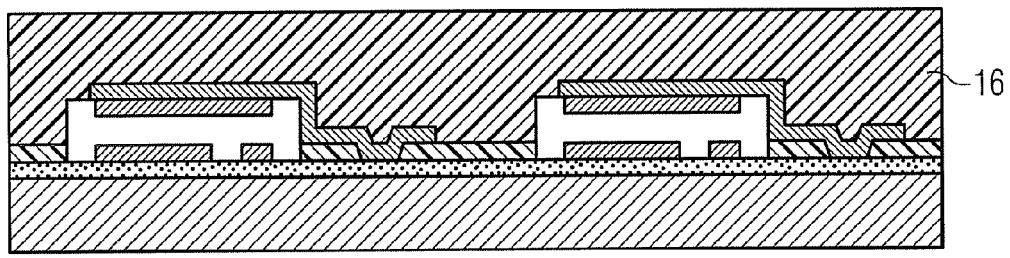
Figure 5F:
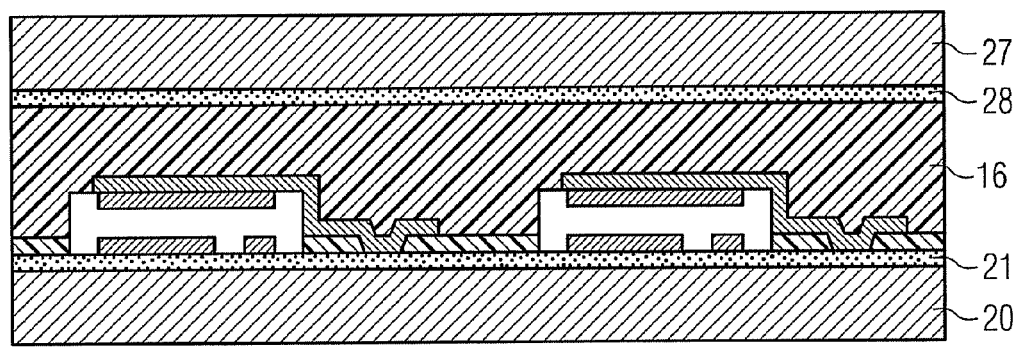
Figure 5G:
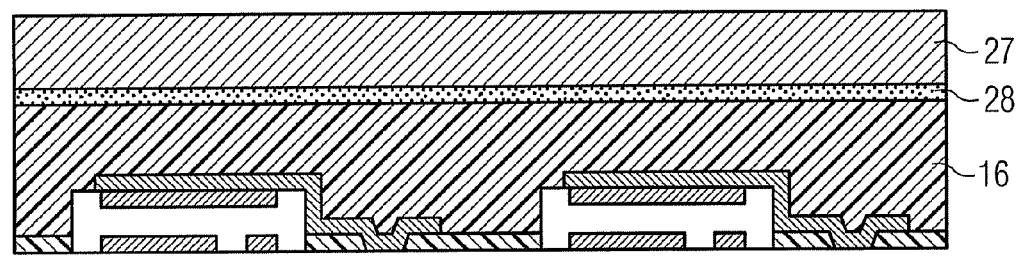
Figure 5H:
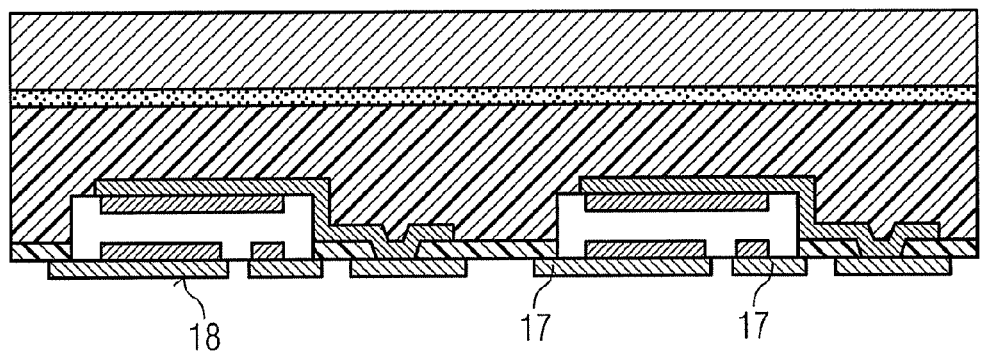
Figure 5I:
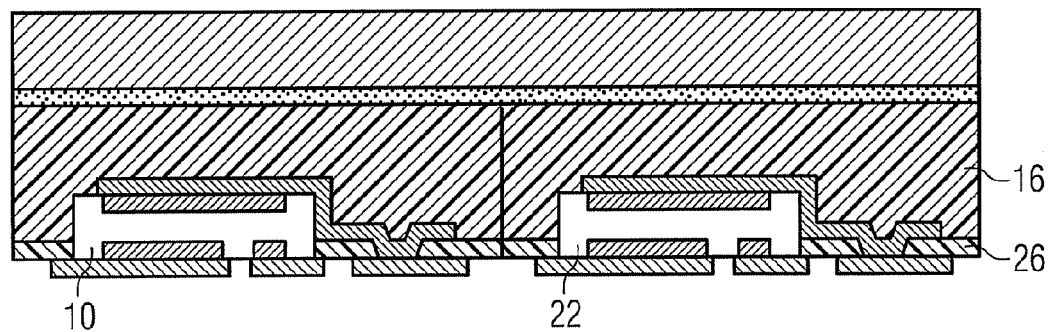
Figure 5J:
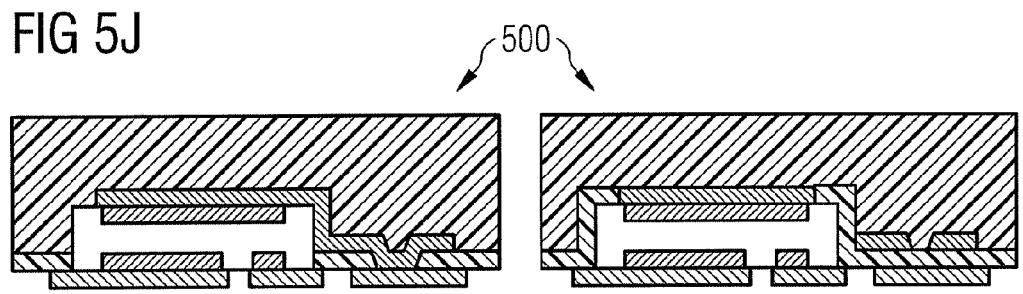

In FIGS. 5A to 5J different stages of the fabrication of a module 500, which is illustrated in FIG. 5J, are exemplarily illustrated. The fabrication method illustrated in FIGS. 5A to 5J is another variation of the fabrication method illustrated in FIGS. 3A to 3J. In contrast to the method of FIGS. 3A to 3J, in the present embodiment the dielectric layer 26 only coats the exposed portions of the top surface of the adhesive tape 21 (see FIG. 5C). The dielectric layer 26 extends to the side surfaces of the semiconductor chips 10 and 22, but does not cover their top surfaces. Furthermore, the dielectric layer 26 has a uniform thickness $d_4$, which is smaller than the height of the semiconductor chips 10 and 22 and, in particular, in the range between 5 and 50 μm. The dielectric layer 26 may, for example, be deposited by ink jet printing. It may be provided that the drain terminals 13 and 23 of the semiconductor chips 10 and 22 are not only arranged on the top surfaces but also extend to the side surfaces of the semiconductor chips 10 and 22. In this case, the dielectric layer 26 as illustrated in FIG. 5C provides sufficient electrical insulation to electrically insulate the drain terminals 13 and 23 from the second electrically conductive layer 17. The fabrication processes of the module 500 illustrated in FIGS. 5E to 5J may be similar or identical to the fabrication processes illustrated in FIGS. 3E to 3J.

Figure 6:
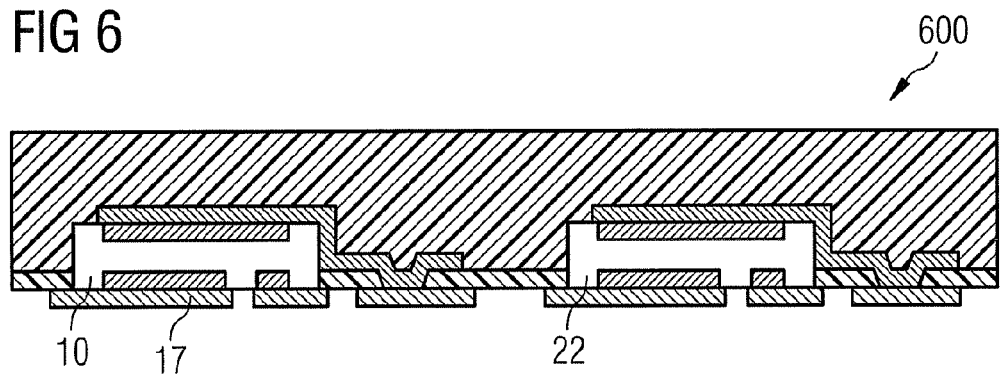
FIG. 6 schematically illustrates a module 600 in a cross section according to an exemplary embodiment.

In the following some modifications of the module 500 are presented. These modifications may analogously be applied to the modules 300 and 400. In FIG. 6 a module 600 is schematically illustrated in a cross section. In contrast to the module 500, the module 600 includes the first semiconductor chip 10 and the second semiconductor chip 22. The module 600 may be fabricated the same way as the module 500, wherein in the fabrication process illustrated in FIG. 5I the semiconductor chips 10 and 22 are not separated. However the semiconductor chips 10 and 22 may be separated from other semiconductor chips, for example, by sawing the electrically insulating material 16 and the dielectric layer 26.

It may further be provided that the module 600 includes more than two semiconductor chips and/or that at least one of the semiconductor chips is a logic chip controlling the other semiconductor chip. Furthermore, at least one of the semiconductor chips 10 and 22 may be arranged with its drain terminal facing the second electrically conductive layer 17. Moreover, the second semiconductor chip 22 may be a power transistor, a power diode, an IGBT or a control chip.

Figure 7:
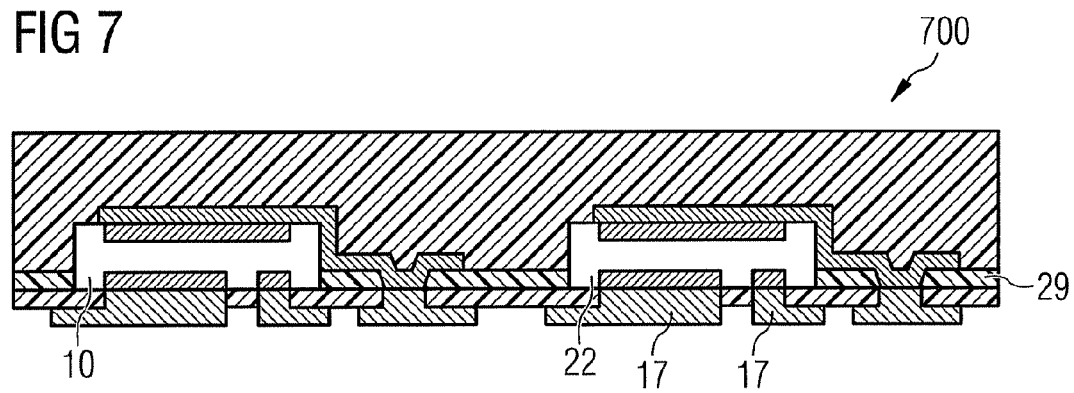
FIG. 7 schematically illustrates a module 700 in a cross section according to an exemplary embodiment.

In FIG. 7 a module 700 is schematically illustrated which is almost identical to the module 600 illustrated in FIG. 6. The difference between the modules 600 and 700 is a dielectric layer 29 of the module 700, which is arranged between the semiconductor chips 10, 22 and the second electrically conductive layer 17. The electrically insulating dielectric layer 29 has openings to establish electrical connections between the second electrically conductive layer 17 and the drain, source and gate terminals of the semiconductor chips 10 and 22. The dielectric layer 29 may, for example, be a photoresist layer or a silicon nitride layer, which may have been structured using a technique known to a person skilled in the art. The modules 100 to 500 described above may also be equipped with the dielectric layer 29 or a similar layer.

Figure 8:
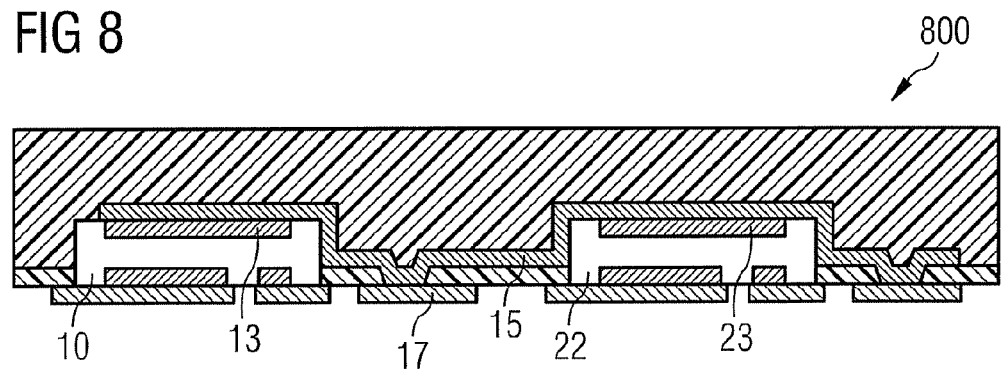
FIG. 8 schematically illustrates a module 800 in a cross section according to an exemplary embodiment.

In FIG. 8 a module 800 is schematically illustrated which is a further modification of the module 600. Here, the drain terminals 13 and 23 of the semiconductor chips 10 and 22 are connected with each other by the first electrically conductive layer 15. Furthermore, the first electrically conductive layer 15 has one or two connections to the second electrically conductive layer 17.

Figure 9:
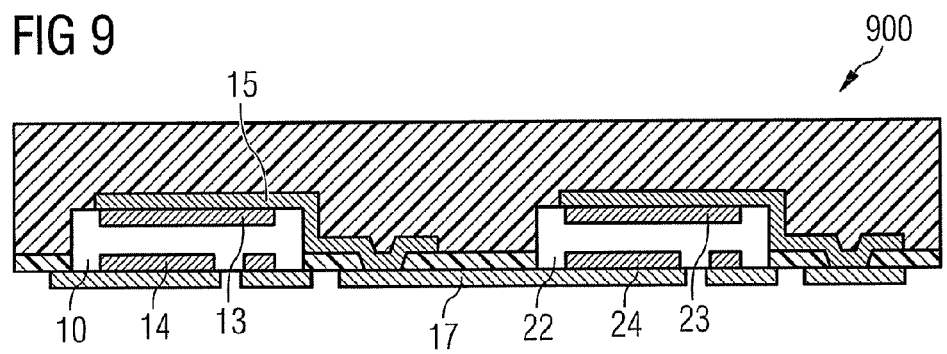
FIG. 9 schematically illustrates a module 900 in a cross section according to an exemplary embodiment.
Figure 10:
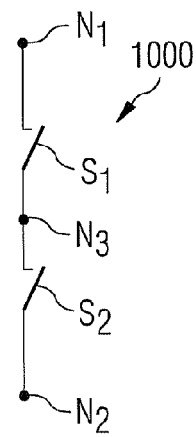
FIG. 10 illustrates a basic circuit of a half-bridge 1000.

In FIG. 9 another example of how the two semiconductor chips 10 and 22 may be connected to each other by using the first and second electrically conductive layers 15 and 17 is schematically illustrated. In the module 900 illustrated in FIG. 9 the drain terminal 13 of the first semiconductor chip 10 is connected to the source terminal 24 of the second semiconductor chip 22 by the first and second electrically conductive layers 15 and 17. Having the connection as illustrated in FIG. 9, the module 900 can be used as a half-bridge. A basic circuit of a half-bridge 1000 arranged between two knots $N_1$ and $N_2$ is illustrated in FIG. 10. The half-bridge 1000 consists of two switches $S_1$ and $S_2$ connected in series. The semiconductor chips 22 and 10 may be implemented as the two switches $S_1$ and $S_2$, respectively. When compared to the module 900 illustrated in FIG. 9, the node $N_1$ is the drain terminal 23 of the second semiconductor chip 22, the node $N_3$ arranged between the two switches $S_1$ and $S_2$ is the drain terminal 13 of the first semiconductor chip 10 and the node $S_3$ is the source terminal 14 of the first semiconductor chip 10.

The half-bridge 900 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage.

Figure 11:
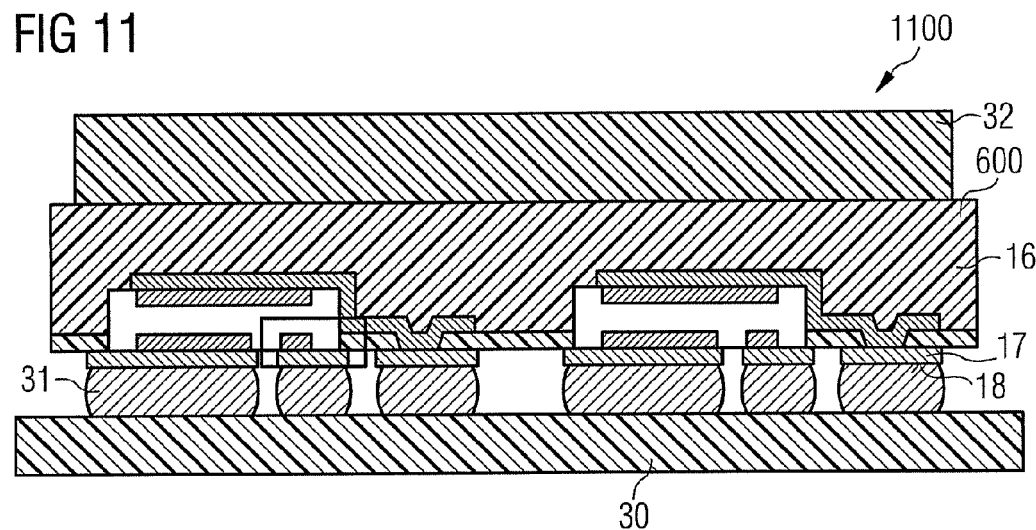
FIG. 11 schematically illustrates a device 1100 in a cross section according to an exemplary embodiment.

The exposed surfaces of the second electrically conductive layer 17 forming the external contact pads 18 may be used to electrically couple the module 600 to other components. This is exemplarily illustrated in FIG. 11. There, an excerpt of a device 1100 is schematically illustrated which includes the module 600 that is mounted onto a circuit board 30, for example, a PCB (Printed Circuit Board). Solder deposits 31 may have been used to solder the external contact pads 18 to contact areas of the circuit board 30.

On top of the module 600, a heat sink or cooling element 32 may be attached. The heat sink 32 may be thermally coupled the electrically insulating material 16. If the thermal conductivity of the electrically insulating material 16 is high enough and/or if the material thickness of the electrically insulating material 16 above the semiconductor chips 10 and 22 is not too large, the electrically insulating material 16 may allow to transfer the heat generated by the semiconductor chips 10 and 22 to the heat sink 32, which dissipates the generated heat.

In addition, while a particular feature or embodiment of the invention may have been disclosed with respect to only one of several implementations, such feature or embodiment may be combined with one or more other features or embodiments of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements illustrated herein are illustrated with particular dimensions relative to one another for purposes of simplicity and ease of understanding, and that actual dimensions may differ substantially from that illustrated herein.

What is claimed is:

1. A module, comprising:
    a first semiconductor chip having a first contact pad on a first main surface and a second contact pad on a second main surface;
    a first electrically conductive layer applied to the first main surface of the first semiconductor chip;
    a second electrically conductive layer applied to the second main surface of the first semiconductor chip;
    a first electrically insulating material covering a surface of the first electrically conductive layer facing away from the first semiconductor chip; and a second electrically insulating material arranged between the first electrically conductive layer and the second electrically conductive layer, wherein the first electrically conductive layer defines a boundary between the first electrically insulating material and the second electrically insulating material, wherein the first electrically insulating material is different from the second electrically insulating material, wherein a surface of the second electrically conductive layer forms an external contact pad and the second electrically conductive layer has a thickness of less than 200 µm, and wherein the second contact pad of the first semiconductor chip is a gate terminal.

2. The module of claim 1, wherein the first semiconductor chip is a power semiconductor chip.

3. The module of claim 1, wherein the first electrically insulating material is an epoxy or mold material, and wherein the second electrically insulating material is photoresist or silicon nitride.

4. The module of claim 1, wherein the first electrically conductive layer is electrically coupled to the second electrically conductive layer.

5. The module of claim 1, wherein the module comprises a first side surface and a second side surface opposite to the first side surface, and wherein the first electrically insulating material extends from the first side surface to the second side surface.

6. The module of claim 1, comprising wherein the module further comprises a second semiconductor chip having a first main surface and a second main surface.

7. The module of claim 6, comprising wherein the first electrically conductive layer is applied to the first main surface of the second semiconductor chip arid/or wherein the second electrically conductive layer is applied to the second main surface of the second semiconductor chip.

8. A module, comprising:
a first semiconductor chip having a first main surface, a second main surface and a gate electrode arranged on the second main surface;
a first electrically conductive layer applied to the first main surface of the first semiconductor chip;
a second electrically conductive layer applied to the second main surface of the first semiconductor chip;
a first electrically insulating material covering a surface of the first electrically conductive layer facing away from the first semiconductor chip; and
a second electrically insulating material arranged between the first electrically conductive layer and the second electrically conductive layer,
wherein the first electrically conductive layer defines a boundary between the first electrically insulating material and the second electrically insulating material,
wherein the first electrically insulating material is different from the second electrically insulating material, and
wherein a surface of the second electrically conductive layer forms an external contact pad.

9. The module of claim 8, wherein the first electrically insulating material is an epoxy or mold material, and
wherein the second electrically insulating material is photoresist or silicon nitride.

10. The module of claim 8, wherein the first electrically conductive layer is electrically coupled to the second electrically conductive layer.

11. The module of claim 8, wherein the module comprises a first side surface and a second side surface opposite to the first side surface, and
wherein the first electrically insulating material extends from the first side surface to the second side surface.

12. The module of claim 8, further comprising a second semiconductor chip.

13. The module of claim 12, comprising wherein the first electrically conductive layer electrically couples the first semiconductor chip to the second semiconductor chip.

* * * * *